United States Patent
Liu

(10) Patent No.: US 8,362,541 B2
(45) Date of Patent: Jan. 29, 2013

(54) MANUFACTURING METHOD OF DYNAMIC RANDOM ACCESS MEMORY

(75) Inventor: Shih-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 291 days.

(21) Appl. No.: 12/765,873

(22) Filed: Apr. 23, 2010

(65) Prior Publication Data

US 2010/0203693 A1 Aug. 12, 2010

Related U.S. Application Data

(62) Division of application No. 11/937,502, filed on Nov. 9, 2007, now Pat. No. 7,732,849.

(30) Foreign Application Priority Data

May 24, 2007 (TW) .............................. 96118502 A

(51) Int. Cl.
 *H01L 27/108* (2006.01)
 *H01L 29/94* (2006.01)
(52) U.S. Cl. . 257/302; 257/304; 257/301; 257/E27.093; 365/149
(58) Field of Classification Search ........... 257/E27.093, 257/301, 302, 303, 304; 438/243; 365/149
See application file for complete search history.

(56) References Cited

U.S. PATENT DOCUMENTS

| | | | | |
|---|---|---|---|---|
| 5,064,777 A | * | 11/1991 | Dhong et al. ................. | 438/242 |
| 5,156,992 A | * | 10/1992 | Teng et al. .................... | 438/246 |
| 6,063,658 A | * | 5/2000 | Horak et al. .................. | 438/248 |
| 6,399,978 B2 | * | 6/2002 | Gruening et al. ............. | 257/301 |
| 6,740,920 B2 | * | 5/2004 | Chidambarrao et al. ..... | 257/302 |
| 7,435,645 B2 | * | 10/2008 | Chien ........................... | 438/257 |
| 7,563,670 B2 | * | 7/2009 | Cheng et al. ................. | 438/243 |
| 2007/0082444 A1 | * | 4/2007 | Chien ........................... | 438/257 |
| 2008/0169494 A1 | * | 7/2008 | Cheng et al. ................. | 257/302 |

OTHER PUBLICATIONS

Stanley Wolf, Silicon Processing for the VLSI ERA, 2000, Lattice Press, vol. 1, pp. 822-824.*
Kwok K Ng, Complete Guide to Semiconductor Devices, 2002, John Wiley & Sons, pp. 184-186.*

* cited by examiner

*Primary Examiner* — Jerome Jackson, Jr.
*Assistant Examiner* — Paul Budd
(74) *Attorney, Agent, or Firm* — Jianq Chyun IP Office

(57) ABSTRACT

A manufacturing method of DRAM is provided. A substrate having a deep trench is provided, and then a deep trench capacitor including a bottom electrode, an upper electrode and a capacitor dielectric layer is formed in the deep trench. A part of the upper electrode of the deep trench capacitor is removed to form a first trench. A buried strap is formed in the substrate on one side of the upper electrode. An isolation structure is formed in the first trench to define an active region. A part of the substrate adjacent to the isolation structure is removed to form a second trench. A first heavily doped region is formed on the bottom of the second trench, and the first heavily doped region is electrically connected to the buried strap. A dielectric layer is formed on the bottom of the second trench.

4 Claims, 12 Drawing Sheets

MANUFACTURING METHOD OF DYNAMIC RANDOM ACCESS MEMORY

CROSS-REFERENCE TO RELATED APPLICATION

This application is a divisional application of and claims priority benefit of an application Ser. No. 11/937,502, filed on Nov. 9, 2007, now allowed, which claims the priority benefit of Taiwan application serial no. 96118502, filed on May 24, 2007. The entirety of the above-mentioned patent applications is hereby incorporated by reference herein and made a part of this specification.

BACKGROUND OF THE INVENTION

1. Field of the Invention

The invention relates to a dynamic random access memory structure and a manufacturing method thereof. More particularly, the invention relates to a dynamic random access memory structure having a vertical transistor and a deep trench capacitor and a manufacturing method thereof.

2. Description of Related Art

In the semiconductor industry, the dynamic random access memory (DRAM) is an important integrated circuit under constant studies and development. A DRAM cell generally includes a transistor and a capacitor controlled by the transistor. Presently, a structure of deep trench capacitor is developed in the DRAM industry, by which a capacitor is fabricated in the substrate to reduce the use of substrate area. Generally, the transistor of the DRAM having a deep trench capacitor is located horizontally on the substrate surface.

With the development of technology, miniaturization of the components is required, and the length of the channel region of a DRAM transistor is gradually shortened for improving the operation speed of the component. However, this will cause a serious short channel effect and a reduction of the on current of the transistor. A conventional solution for resolving the above problems is to increase the doping concentration of the channel region. However, this method may also increase the leakage, and therefore reduce the reliability of components. Moreover, a conventional DRAM has a narrow process window, misalignment usually occurs due to an overlay error between the deep trench and the gate.

To solve the problems of the conventional techniques, a structure of vertical transistor is provided in the DRAM industry for substituting the horizontal transistor, by which a vertical transistor is fabricated in a deep trench and disposed above a deep trench capacitor, and the vertical transistor is electrically connected to the deep trench capacitor through a buried strap (BS) formed on the sidewalls of the deep trench. However, the doping concentration of the buried strap is generally increased to ensure the buried strap electrically connecting the vertical transistor, and this will cause a floating body effect due to abnormal contact between the buried strap and the adjacent deep trench. The floating body effect means that the charges cannot discharge through the silicon substrate due to insulation of the buried strap. This problem may reduce the reliability and stability of the components.

SUMMARY OF THE INVENTION

Accordingly, the invention is directed to a dynamic random access memory (DRAM) and a manufacturing method thereof for solving the short channel effect and the floating body effect, so as to enhance the effectiveness of components.

The invention provides a DRAM including a substrate, a vertical transistor, a deep trench capacitor and a buried strap. The substrate has a trench and a deep trench located on one side of the trench thereon. The vertical transistor is disposed in the trench, and a portion of the vertical transistor is disposed on the substrate. The deep trench capacitor is disposed in the deep trench. The vertical transistor comprises a gate structure disposed in the trench, a first doped region disposed in the substrate on sidewalls and bottom of the trench, and a second doped region disposed in the substrate on top of the trench. The deep trench capacitor comprises a bottom electrode disposed in the substrate on bottom of the deep trench, a capacitor dielectric layer disposed on sidewalls and bottom of the deep trench, and an upper electrode disposed in the deep trench on the capacitor dielectric layer. The buried strap is disposed in the substrate below the vertical transistor, and adjoined to the first doped region and the upper electrode.

According to an embodiment of the invention, the gate structure may include a gate and a gate dielectric layer, wherein the gate is disposed on the substrate and fills the trench. The gate dielectric layer is disposed between the gate and the substrate, and the material thereof may be silicon oxide, for example.

According to an embodiment of the invention, the buried strap may be buried doped region and formed by performing a thermal diffusion process.

The DRAM according to an embodiment of the invention further includes a channel doped region disposed between the first doped region and the second doped region, and disposed in the substrate on sidewalls of the trench.

The DRAM according to an embodiment of the invention further includes a dielectric layer disposed between the gate structure and the first doped region.

According to an embodiment of the invention, the aforementioned upper electrode may include a first conductive layer, a second conductive layer and a third conductive layer. The first conductive layer is disposed on the bottom of the deep trench. The second conductive layer is disposed on the first conductive layer. The third conductive layer is disposed on the second conductive layer, wherein its surface is below the bottom of the trench. The material of the first conductive layer, the second conductive layer and the third conductive layer may be doped polysilicon, for example. Moreover, the deep trench capacitor further includes a collar dielectric layer disposed on sidewalls of the deep trench above the first conductive layer, and surrounds the second conductive layer. The material of the collar dielectric layer may be silicon oxide, for example.

The channel region of the vertical transistor of the DRAM is disposed in the substrate on sidewalls of the trench between the first doped region and the second doped region. Therefore, the gate width of the vertical transistor on the substrate can be reduced to improve the integration of the component. Moreover, the length of the channel region of the vertical transistor can be accurately controlled by adjusting the depth of the trench, such that the short channel effect and other problems due to miniaturization of the components can be avoided. In addition, since the first doped region of the vertical transistor is adjoined to the upper electrode of the trench capacitor, the doping concentration of the buried strap can be designed according to the processing criteria, such that the floating body effect caused by abnormal contact between the buried doped region and the adjacent deep trench due to excessive doping concentration of the buried strap can be avoided.

The invention provides a manufacturing method of the DRAM, which includes the following steps. First, a substrate having a deep trench is provided, and then a deep trench capacitor including a bottom electrode, an upper electrode and a capacitor dielectric layer is formed in the deep trench. Next, a part of the upper electrode of the deep trench capacitor is removed to form a first trench. Then, a buried strap is formed in the substrate on one side of the upper electrode. Next, an isolation structure is formed in the first trench to define an active region. Then, a part of the substrate adjacent to the isolation structure is removed to form a second trench. Next, a first heavily doped region is formed on the bottom of the second trench, and the first heavily doped region is electrically connected to the buried strap. Then, a dielectric layer is formed on the bottom of the second trench. Next, a first lightly doped region is formed on sidewalls of the second trench, and the first lightly doped region is electrically connected to the first heavily doped region. Then, a second lightly doped region is formed on the exposed substrate, and the second lightly doped region is adjacent to the second trench. Next, a gate structure is formed on the top of the substrate, and the gate structure fills the second trench. Then, a second heavily doped region is formed in the substrate, and the second heavily doped region is electrically connected to the second lightly doped region.

According to an embodiment of the invention, the gate structure may be fabricated by the following process. First, a gate dielectric layer is formed to conformally cover the whole substrate. Then, a conductive layer is formed on the gate dielectric layer, and the conductive layer is filled inside the trench. Last, the conductive layer and the gate dielectric layer are patterned. The material of the gate dielectric layer may be silicon oxide, for example.

According to an embodiment of the invention, the buried strap may be buried doped region formed by thermal diffusion.

According to an embodiment of the invention, a channel doped region is formed in the substrate on sidewalls of the trench after the step of forming the first lightly doped region but before the step of forming the second lightly doped region.

According to an embodiment of the invention, the deep trench capacitor in the deep trench may be fabricated by the following process. First, a bottom electrode is formed in the substrate on the bottom of the deep trench. Next, a capacitor dielectric layer is formed on the surface of the deep trench. Then, the first conductive layer is filled in the bottom of the deep trench. Next, the capacitor dielectric layer not covered by the first conductive layer is removed. Then, a collar dielectric layer is formed on sidewalls of the deep trench not covered by the first conductive layer. Next, the second conductive layer is filled in the deep trench to cover the first conductive layer. Then, a portion of the second conductive layer and a portion of the collar dielectric layer are removed to ensure the surface of the second conductive layer is lower than that of the substrate. Next, the third conductive layer is filled in the deep trench, wherein the first conductive layer, the second conductive layer and the third conductive layer form the upper electrode. The material of the collar dielectric layer may be silicon oxide, for example. The material of the first conductive layer, the second conductive layer and the third conductive layer may be doped polysilicon, for example.

According to an embodiment of the invention, the bottom of the second trench is above the surface of the upper electrode of the trench capacitor.

According to an embodiment of the invention, the second lightly doped region may be formed via tilt-angle ion implantation.

According to an embodiment of the invention, the second trench may be formed by the following process. First, a patterned second mask layer is formed using the deep trench as an alignment reference object. Then, the second trench is formed using the patterned second mask layer as an etching mask. Therefore, the misalignment usually occurring due to an overlay error between the deep trench and the gate can be avoided, and the process windows may be increased. Moreover, since the length of the channel region of the vertical transistor is determined by the depth of the trench, the length of the channel region of the vertical transistor will not be limited to the photolithographic etching process, therefore the integration of components can be improved. Meanwhile, during the formation of the buried strap, the doping concentration of the buried strap can be designed only according to the processing criteria, and improvement of the doping concentration is unnecessary, such that the floating body effect due to excessive doping concentration of the buried strap can be avoided.

In order to make the aforementioned and other features and advantages of the invention comprehensible, an embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A to 2K are cross-sectional views illustrating a manufacturing process of a DRAM cell according to an embodiment of the invention.

DESCRIPTION OF EMBODIMENTS

Figure 1:
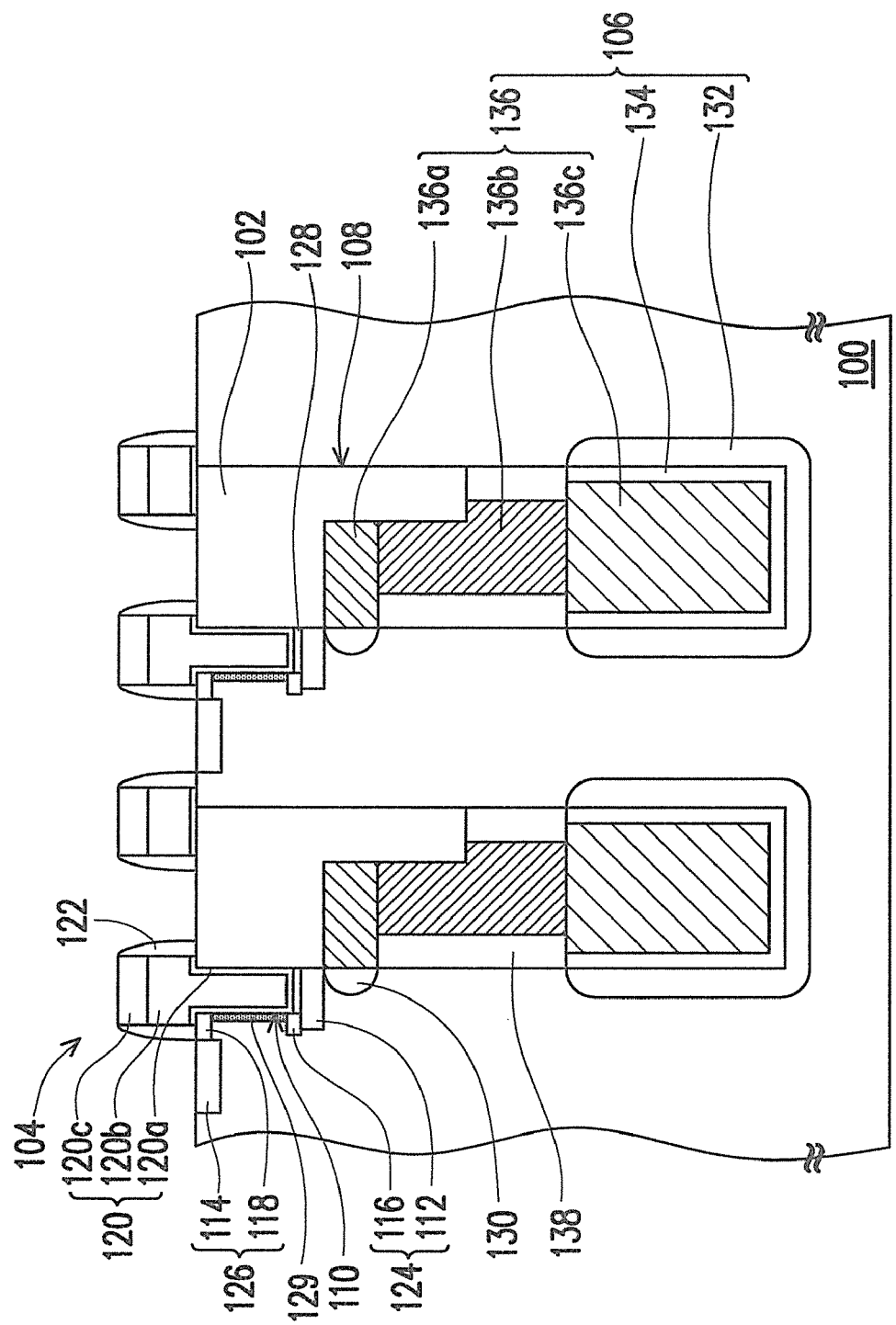
FIG. 1 is a cross-sectional view of a DRAM according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a DRAM according to an embodiment of the invention.

Referring to FIG. 1, the dynamic random access memory (DRAM) includes a substrate 100, an isolation structure 102, a buried strap 130, a vertical transistor 104 and a deep trench capacitor 106. The substrate 100 may be a silicon substrate. A deep trench 108 and a trench 110 are disposed in the substrate 100. The deep trench 108 is located on one side of the trench 110, and has a depth greater than that of the trench 110. The isolation structure 102 is disposed on the deep trench capacitor 106 to define an active region. The isolation structure 102 may be a shallow trench isolation structure, and the material thereof may be silicon oxide, for example.

The vertical transistor 104 may be disposed on the substrate 100. The vertical transistor 104 includes a first doped region 124, a second doped region 126 and a gate structure 120.

The gate structure 120 may include a gate dielectric layer 120a and a gate 120b. The gate 120b is disposed in the trench 110, and the material thereof may be, for example, a doped polysilicon layer, or a combination of a doped polysilicon layer and a metal silicide layer, wherein the metal silicide layer may be a tungsten silicide layer. The gate dielectric layer 120a is disposed between the gate 120b and the substrate 100, and the material thereof may be silicon oxide, for example. A cap layer 120c may be disposed on the gate 120b according to an actual requirement, and the material thereof may be silicon oxide, for example, silicon nitride or other suitable insulated materials. A spacer 122 may be disposed on sidewalls of the gate structure 120 according to an actual requirement, and the material thereof may be, for example, silicon oxide, silicon nitride or other suitable insulated materials.

The first doped region 124 is disposed in the substrate 100 on the bottom of the trench 110. The first doped region 124 includes a first heavily doped region 112 and a first lightly doped region 116. The first heavily doped region 112 is disposed below the gate structure 120, and is adjoined to the isolation structure 102; the first lightly doped region 116 is disposed in the substrate 100 on sidewalls of the trench 110, and is electrically connected to the first heavily doped region 112. Moreover, the second doped region 126 is disposed in the substrate 100 on the top of the trench 110. The second doped region 126 includes a second heavily doped region 114 and a second lightly doped region 118. The second heavily doped region 114 is disposed in the substrate 100 on one side of the trench 110; the second lightly doped region 118 is disposed in the substrate 100 between the gate structure 120 and the second heavily doped region 114, and is electrically connected to the second heavily doped region 114. The first doped region 124 is similar to the second doped region 126, and may be an N-type doped region or a P-type doped region.

In addition, a dielectric layer 128 can be disposed in the substrate 100. The dielectric layer 128 is adjoined to the gate structure 120 and the first doped region 124, and the material thereof may be, for example, silicon oxide or other suitable insulated materials. The dielectric layer 128 is used for preventing an abnormal electrical connection between the gate 120b and the first doped region 124. A channel doped region 129 may also be disposed in the substrate 100 on sidewalls of the trench 110 according to an actual requirement, and the doping concentration thereof is less than that of the first lightly doped region 116 and the second lightly doped region 118. The channel doped region 129 is used for adjusting the threshold voltage of the components.

The deep trench capacitor 106 is disposed in the deep trench 108 and located below the isolation structure 102. Namely, the deep trench capacitor 106 is adjoined to the vertical transistor 104. The deep trench capacitor 106 may include a bottom electrode 132, a capacitor dielectric layer 134 and an upper electrode 136.

The upper electrode 136 of the deep trench capacitor 106 is disposed in the deep trench 110. In the present embodiment, the upper electrode 136 may consist of conductive layers 136a, 136b and 136c. The conductive layer 136c may be disposed on the bottom of the deep trench 110. The conductive layer 136b may be disposed on the conductive layer 136c. The conductive layer 136a may be disposed on the conductive layer 136b and adjoined to the bottom of the first heavily doped region 112. The material of the conductive layers 136a, 136b and 136c may be doped polysilicon, for example. The bottom electrode 132 of the deep trench capacitor 106 may be disposed in the substrate 100 on the bottom of the deep trench 110. The bottom electrode 132 may be a doped region. The capacitor dielectric layer 134 is disposed on sidewalls and bottom of the deep trench 110. Namely, the capacitor dielectric layer 134 is disposed between the conductive layer 136c and the bottom electrode 132 (substrate 100). Moreover, a collar dielectric layer 138 may be disposed between the conductive layer 136c and the substrate 100, and the material thereof may be silicon oxide.

In addition, a buried strap 130 is further disposed in the substrate 100 below the vertical transistor 104. The buried strap 130 is adjoined to the upper electrode 136 and the bottom of the first doped region 124. The buried strap 130 may be a buried doped region formed by thermal diffusion.

In the aforementioned embodiment of the invention, the upper electrode of the deep trench capacitor including three conductive layers (conductive layers 136a, 136b and 136c) is taken as an example. Certainly, the upper electrode of the deep trench capacitor may comprise one conductive layer, two conductive layers, or more than three conductive layers.

In the aforementioned embodiment, the DRAM includes the vertical transistor 104 and the trench capacitor 106. Since the channel region (vertical channel region) of the vertical transistor 104 is disposed in the substrate 100 on the sidewalls of the trench 110 between the first doped region 124 and the second doped region 126, the width of the gate 120b of the vertical transistor 104 on the substrate 100 can be reduced to increase the integration of the components. Moreover, the length of the channel region of the vertical transistor 104 can be accurately controlled by adjusting the depth of the trench 110, such that the short channel effect and other problems due to miniaturization of the components can be avoided. Moreover, since the first doped region 124 of the vertical transistor 104 is adjoined to the upper electrode 136 of the trench capacitor 106, the doping concentration of the buried strap 130 can be designed according to the processing criteria, such that the floating body effect caused by abnormal contact between the buried doped region and the adjacent deep trench due to excessive doping concentration of the buried strap can be avoided.

Next, a fabrication method of the DRAM cell of the invention is illustrated in FIGS. 2A to 2K. FIGS. 2A to 2K are cross-sectional views illustrating a manufacturing process of a DRAM cell according to an embodiment of the invention.

Figure 2A:
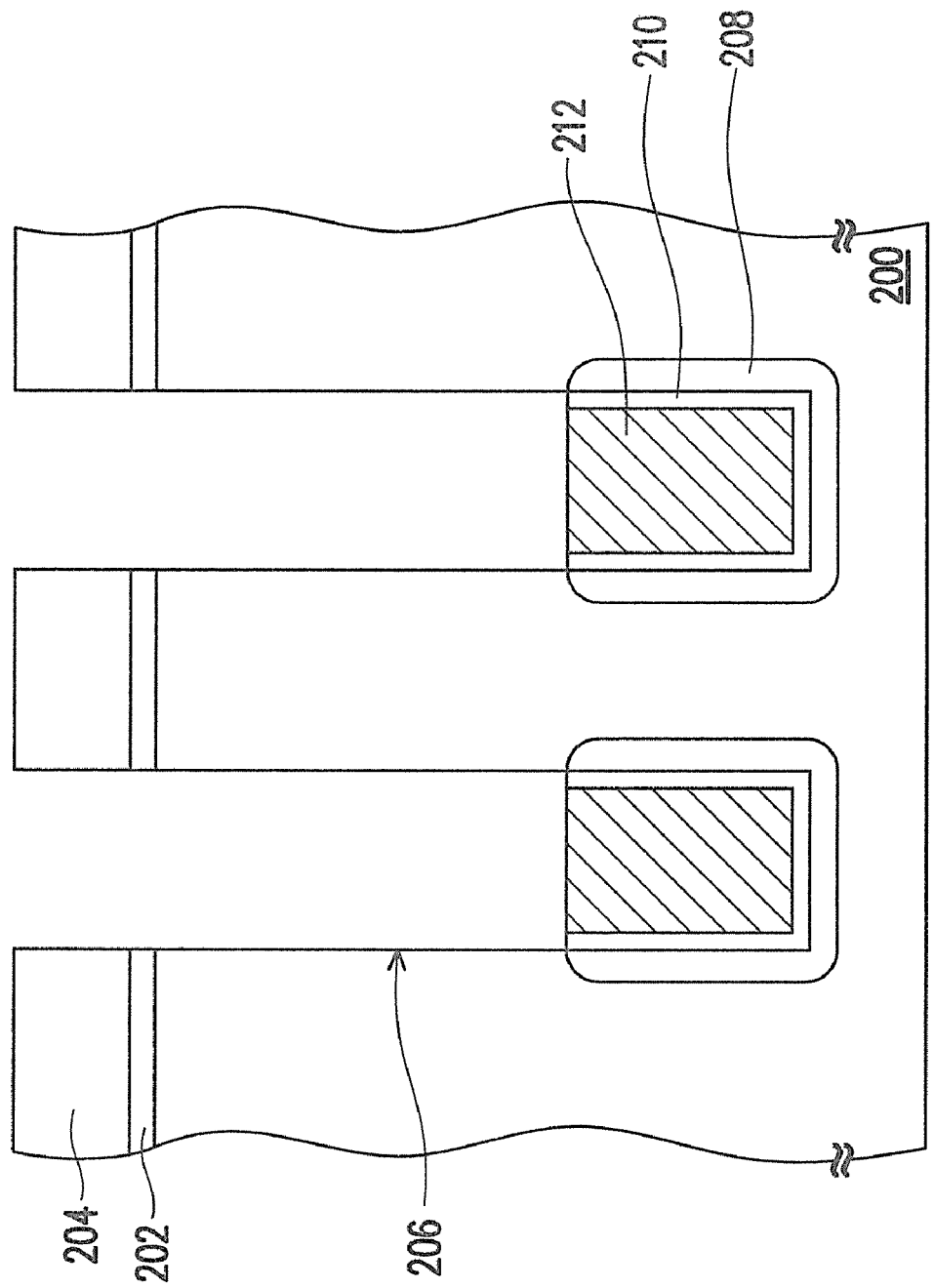

First, referring to FIG. 2A, a substrate 200 which may be a silicon substrate is provided. Then, a first mask layer including a pad oxide layer 202 and a pad nitride layer 204 is formed on the substrate 200. The material of the pad oxide layer 202 may be, for example, oxide silicon, and the pad oxide layer 202 may be formed via thermal oxidation. The material of the pad nitride layer 204 may be, for example, nitride silicon, and the pad nitride layer 204 may be formed via chemical vapor deposition.

Next, a photolithographic process and an etching process are performed on the pad nitride layer 204 and the pad oxide layer 202 to form a patterned pad oxide layer 202 and a patterned pad nitride layer 204. Then, an etching process is performed while taking the patterned pad oxide layer 202 and pad nitride layer 204 as masks to form a deep trench 206 in the substrate 200, wherein the etching process may be a dry etching process.

Next, referring to FIG. 2A, a bottom electrode 208 is formed in the substrate 200 on the bottom of the deep trench 206. The bottom electrode 208 may be a doped region. Those skilled in the art are familiar with the fabrication method of the bottom electrode 208, and therefore the description thereof is omitted. Then, a capacitor dielectric layer 210 and a conductive layer 212 are formed on the bottom of the deep trench 206. For example, the capacitor dielectric layer 210 and the conductive layer 212 may be formed by the following process. First, a dielectric layer (not shown) is formed on the surface of the deep trench 206 and on the substrate 200, and the material of the dielectric layer may be, for example, silicon oxide, silicon nitride, silicon oxynitride or other suitable dielectric materials. The dielectric layer may be formed via thermal oxidation, chemical vapor deposition or other suitable processes. Next, the conductive layer 212 is formed in the deep trench 206 to cover a part of the dielectric layer. The material of the conductive layer 212 may be, for example, polysilicon, doped polysilicon or other suitable conductive materials. The conductive layer 212 may be formed by means of in-situ ion doping, by which after a doped polysilicon layer is formed on the substrate 200 via chemical vapor deposition, the doped polysilicon layer outside the deep trench 206 and the doped polysilicon layer on the top of the deep trench 206 are removed to form the conductive layer 212. Next, an etching process is performed to remove the dielectric layer not covered by the conductive layer 212, so as to form the capacitor dielectric layer 210.

Figure 2B:
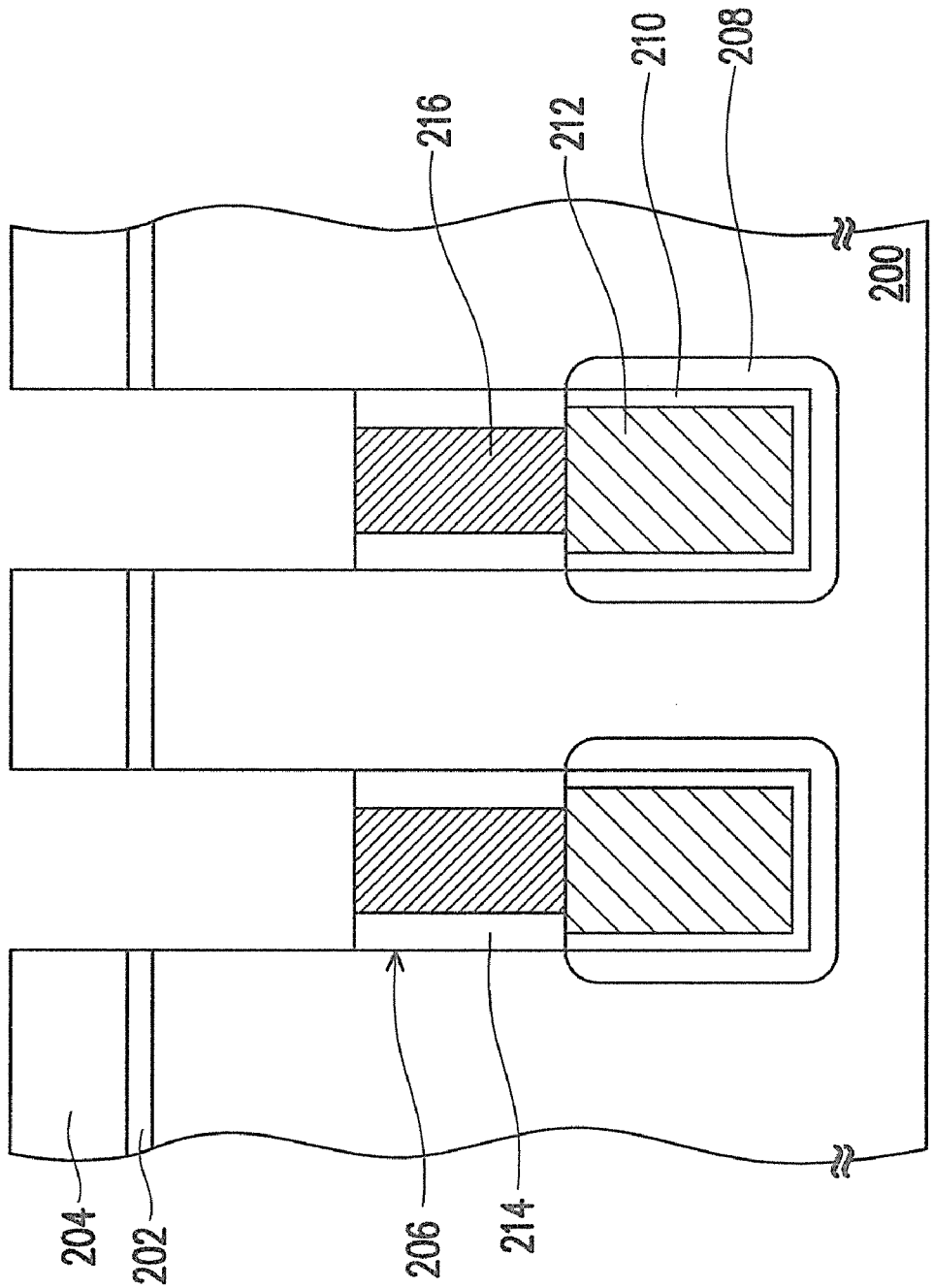

Next, referring to FIG. 2B, a collar dielectric layer 214 is formed on the sidewalls of the deep trench 206 not covered by the conductive layer 212, and the material thereof may be silicon oxide. The collar dielectric layer 214 may be formed by the following process. First, a chemical vapor deposition process is performed to form a conformal collar dielectric material layer. Next, the collar dielectric material layer outside the deep trench 206 and the collar dielectric layer on the top of the conductive layer 212 are removed to form the collar dielectric layer 214 by performing, for example, an anisotropic etching process.

Next, a conductive layer 216 is filled in the deep trench 206, and covers the conductive layer 212, wherein the conductive layer 216 is electrically connected to the conductive layer 212. Next, a portion of the conductive layer 216 and a portion of the collar dielectric layer 214 are removed to ensure the conductive layer 216 and the collar dielectric layer 214 are below the surface of the substrate 200. The material and fabrication method of the conductive layer 126 are similar to that of the conductive layer 212, and the description thereof will be omitted hereby.

Figure 2C:
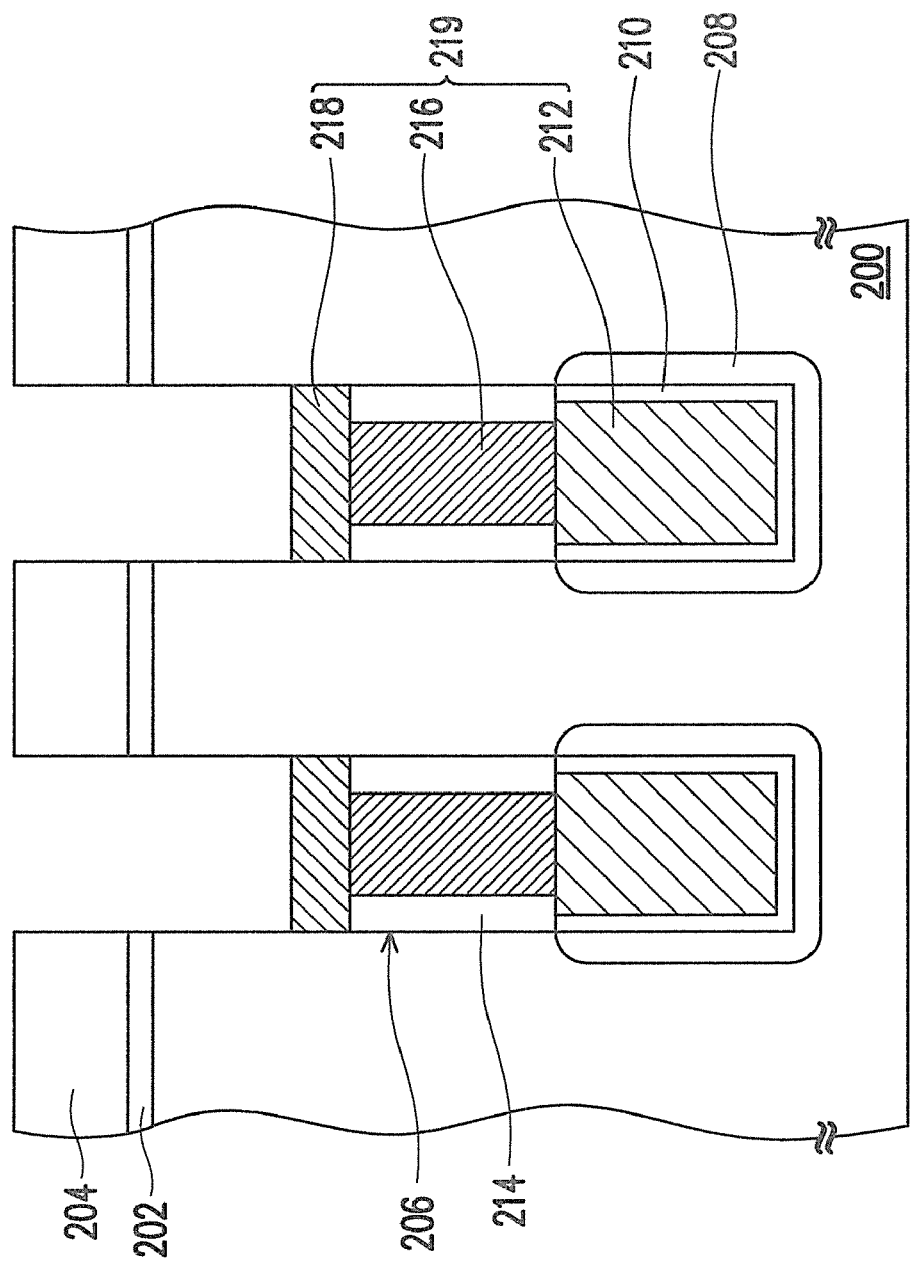

Next, referring to FIG. 2C, the conductive layer 218 is filled in the deep trench 206, and covers the conductive layer 216, wherein the conductive layer 218 is electrically connected to the conductive layer 216. The material and fabrication method of the conductive layer 128 are similar to that of the conductive layer 212, and therefore the description thereof will be omitted hereby. The conductive layers 212, 216 and 218 form an upper electrode 219 of the trench capacitor.

Figure 2D:
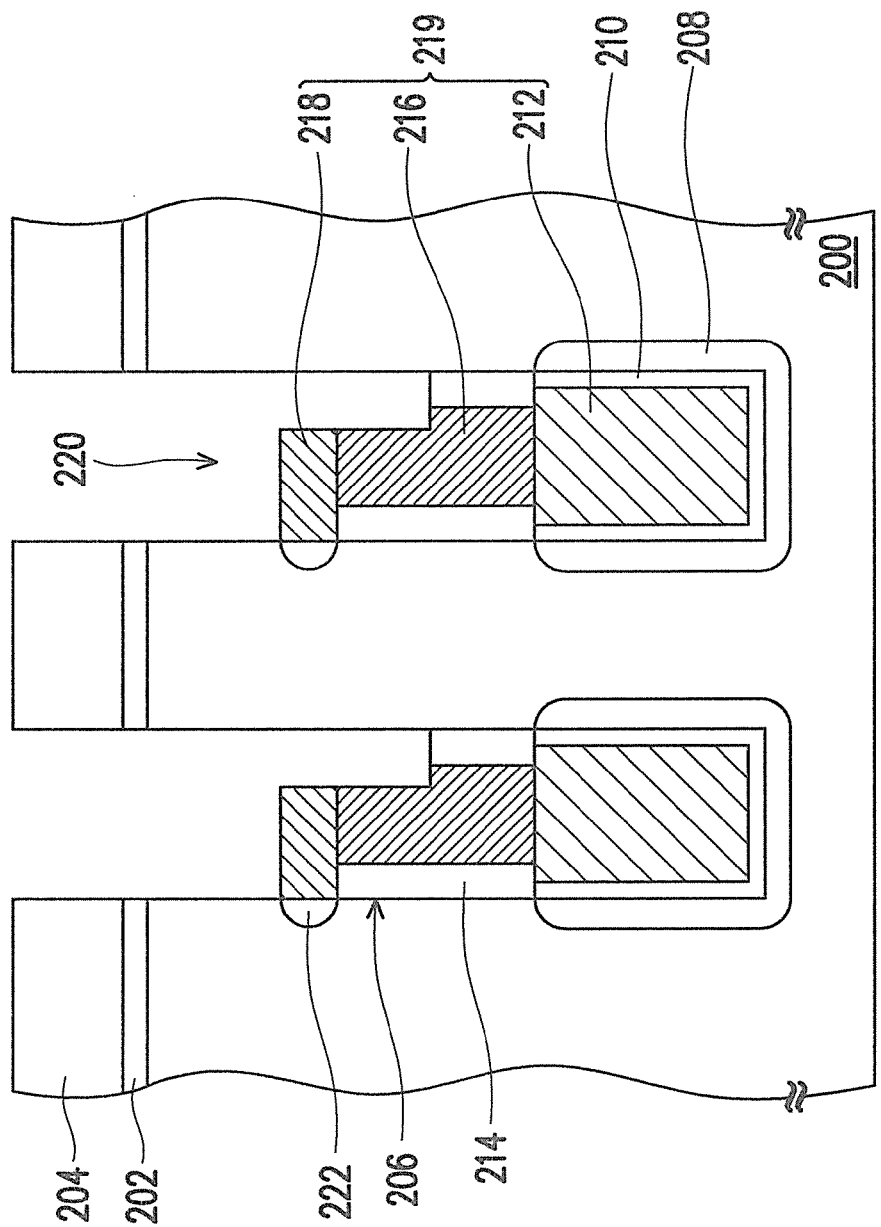

Next, referring to FIG. 2D, a trench 220 is formed in the substrate 200 on one side of the conductive layer 218. The trench 220 exposes a portion of the collar dielectric layer 214 and a portion of the conductive layers 216 and 218. The trench 220 is formed by performing an etching process. Next, after the trench 220 is formed, a buried strap 222 is formed in the substrate 200 on one side of the conductive layer 218, and the buried strap 222 is electrically connected to the conductive layer 218. The buried strap 222 may be a buried doped region formed by thermal diffusion. In detail, the buried strap 222 may be formed by diffusing the dopant of the conductive layer 218 into the substrate 200 by a thermal process.

Figure 2E:
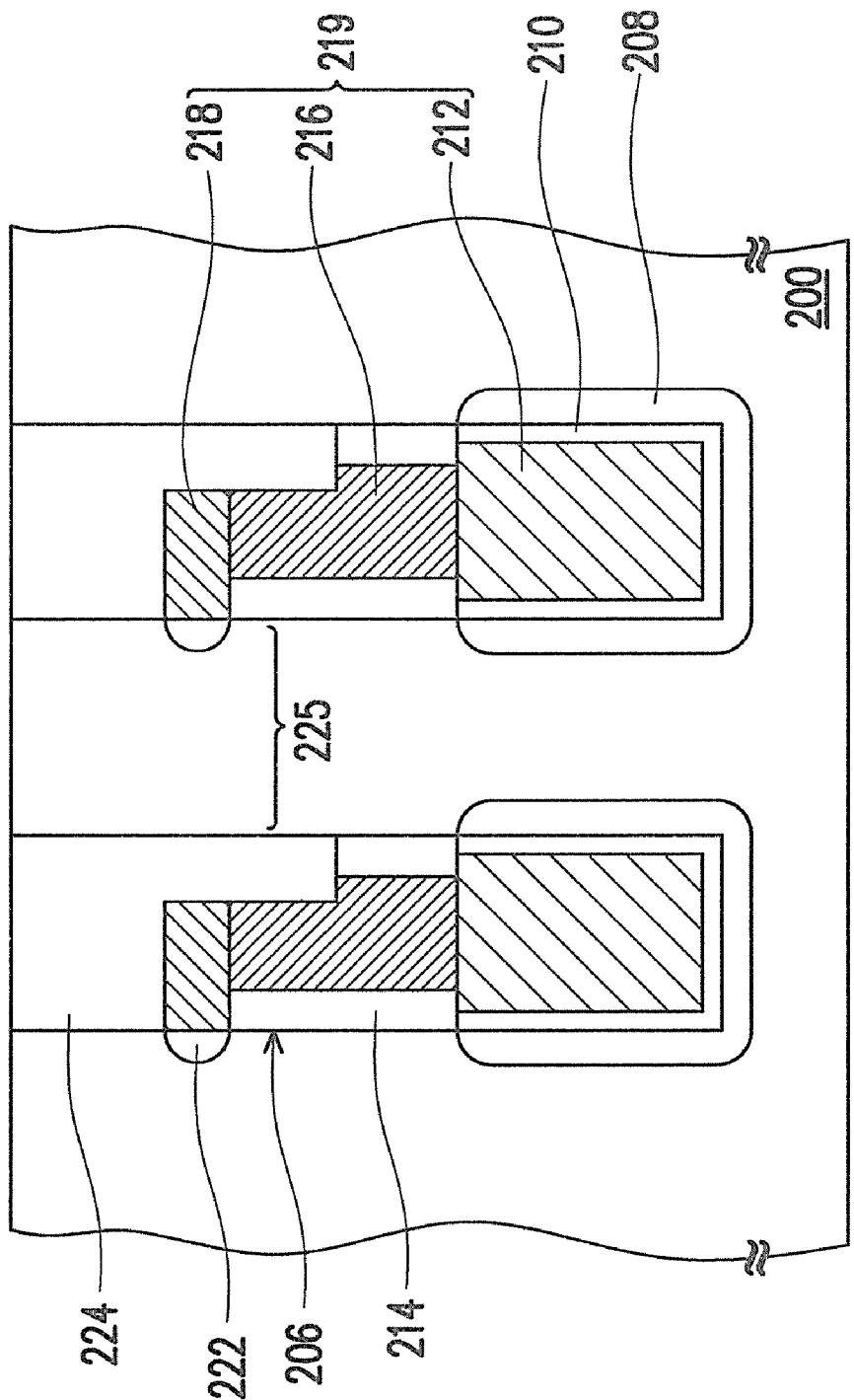

Next, referring to FIG. 2E, an isolation structure 224 is formed by filling insulation materials in the trench 220, and accordingly, an active region 225 is defined. The material of the isolation structure 224 may be, for example, silicon oxide, and the isolation structure 224 may be fabricated by the following process. First, an insulation layer for filling the trench 220 is formed via a deposition process. Next, the insulation layer outside the trench 220 is removed to form the isolation structure 224 via a chemical mechanical grinding process or an etch back process. Next, after the isolation structure 224 is formed, the pad nitride layer 204 and the pad oxide layer 202 are sequentially removed.

Figure 2F:
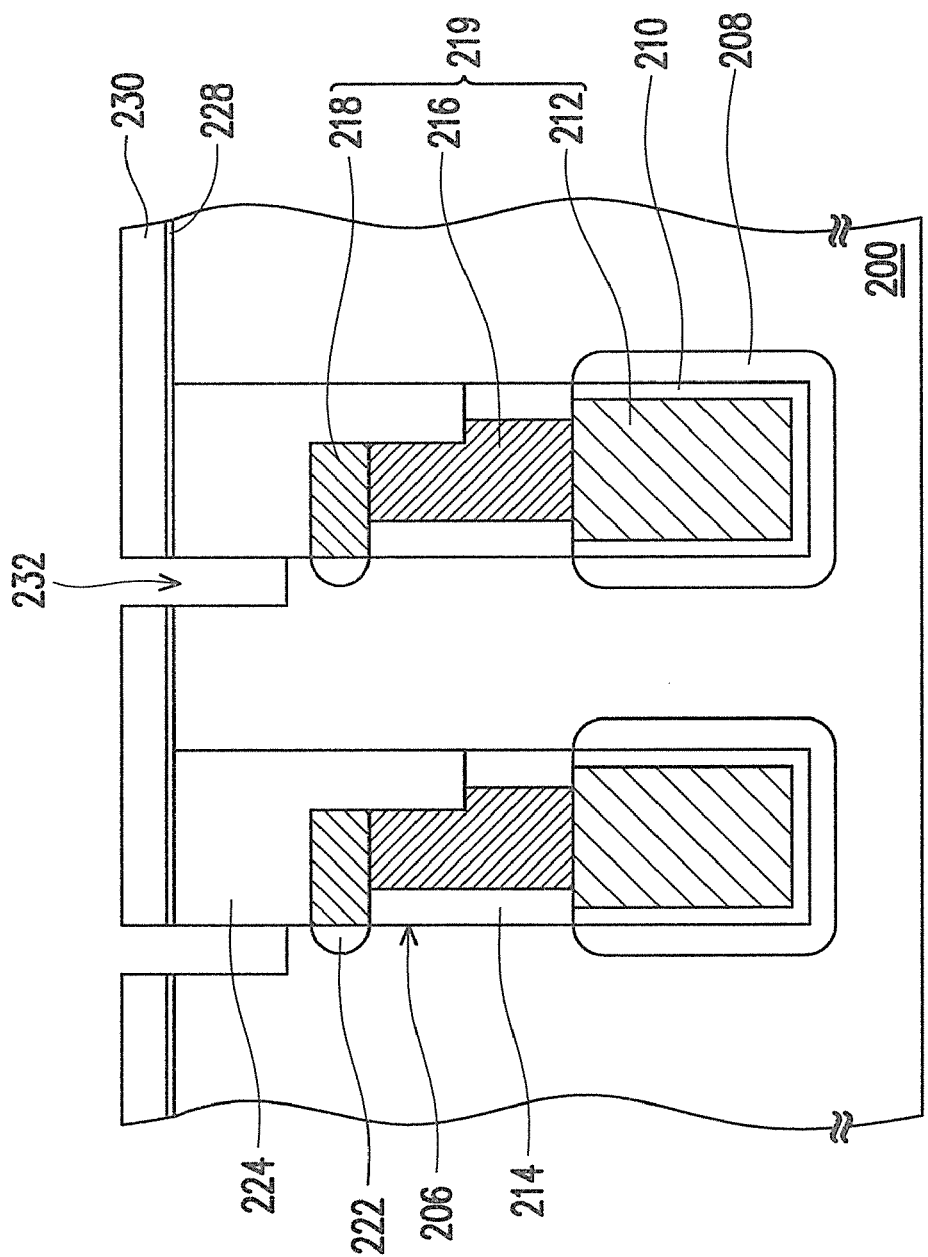

Next, the correlative manufacturing processes of the vertical transistor are performed. Referring to FIG. 2F, a second mask layer including a pad oxide layer 228 and a pad nitride layer 230 is formed over the substrate 200 covering the isolation structure 224 and the substrate 200. The material of the pad oxide layer 228 may be, for example, silicon oxide, and the pad oxide layer 228 may be formed via chemical vapor deposition. Moreover, the material of the pad nitride layer 230 may be, for example, silicon nitride, and may be formed via chemical vapor deposition.

Next, a photolithographic process and an etching process are performed on the pad nitride layer 230 and the pad oxide layer 228 to form a patterned pad nitride layer 230 and a patterned pad oxide layer 228. As described above, a portion of the region of the substrate 200 exposed on the patterned pad nitride layer 230 and the patterned pad oxide layer 228 is adjoined to the isolation structure 224. Next, an etching process is performed to form a trench 232 in the substrate 200 using the patterned pad nitride layer 230 and the patterned pad oxide layer 228 as a mask, wherein the etching process may be a dry etching process. Meanwhile, the bottom of the trench 232 is above the surface of the upper electrode 219 of the trench capacitor. It should be noted that a portion of the vertical transistor is formed in the trench 232, and the length of the channel region of the vertical transistor can be precisely controlled by adjusting the depth of the trench 232.

Figure 2G:
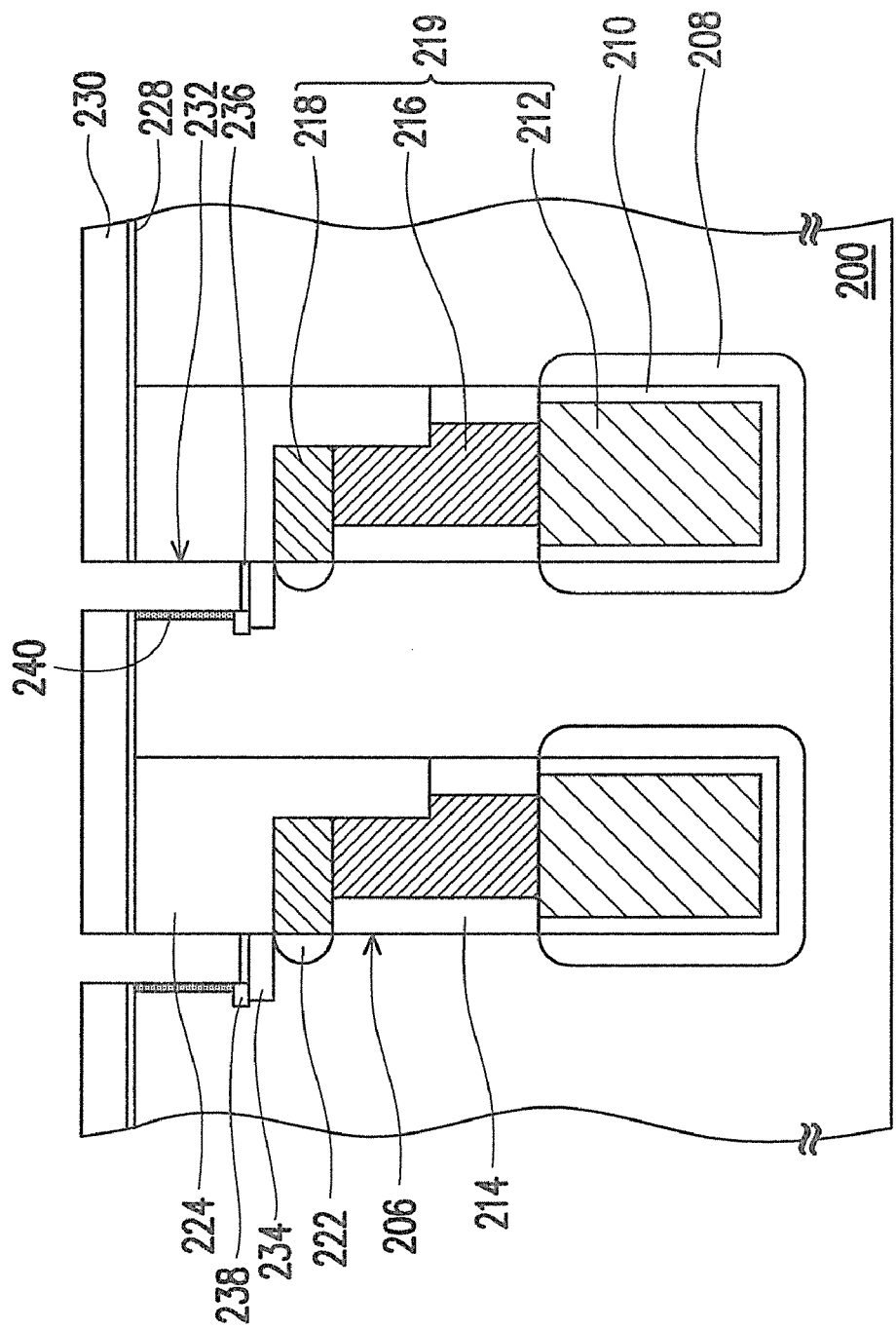

Next, referring to FIG. 2G, a first heavily doped region 234 is formed in the substrate on the bottom of the trench 232, and is electrically connected to the buried strap 222. The first heavily doped region 234 may be formed via an ion implantation process. Next, after the first heavily doped region 234 is formed, a dielectric layer 236 is formed in the trench 232 to prevent an abnormal electrical connection between the subsequently formed gate and the first heavily doped region 234. The material of the dielectric layer 236 may be, for example, silicon oxide or other suitable insulation materials. The dielectric layer 236 may be fabricated by the following process. First, an insulation layer is formed to fill the trench 232, and then, an etch back process is performed to remove a portion of the insulation layer, so as to form the dielectric layer 236.

Next, after the dielectric layer 236 is formed, a first lightly doped region 238 is formed on sidewalls of the trench 232, and is electrically connected to the first heavily doped region 234. The first lightly doped region 238 may be formed via tilt-angle ion implantation. Next, after the first lightly doped region 238 is formed, a channel doped region 240 can be formed according to an actual requirement. The channel doped region 240 is formed in the substrate 200 on sidewalls of the trench 232. The doping concentration of the channel doped region 240 is less than that of the first lightly doped region 238, and the channel doped region 240 may be formed via ion implantation.

Figure 2H:
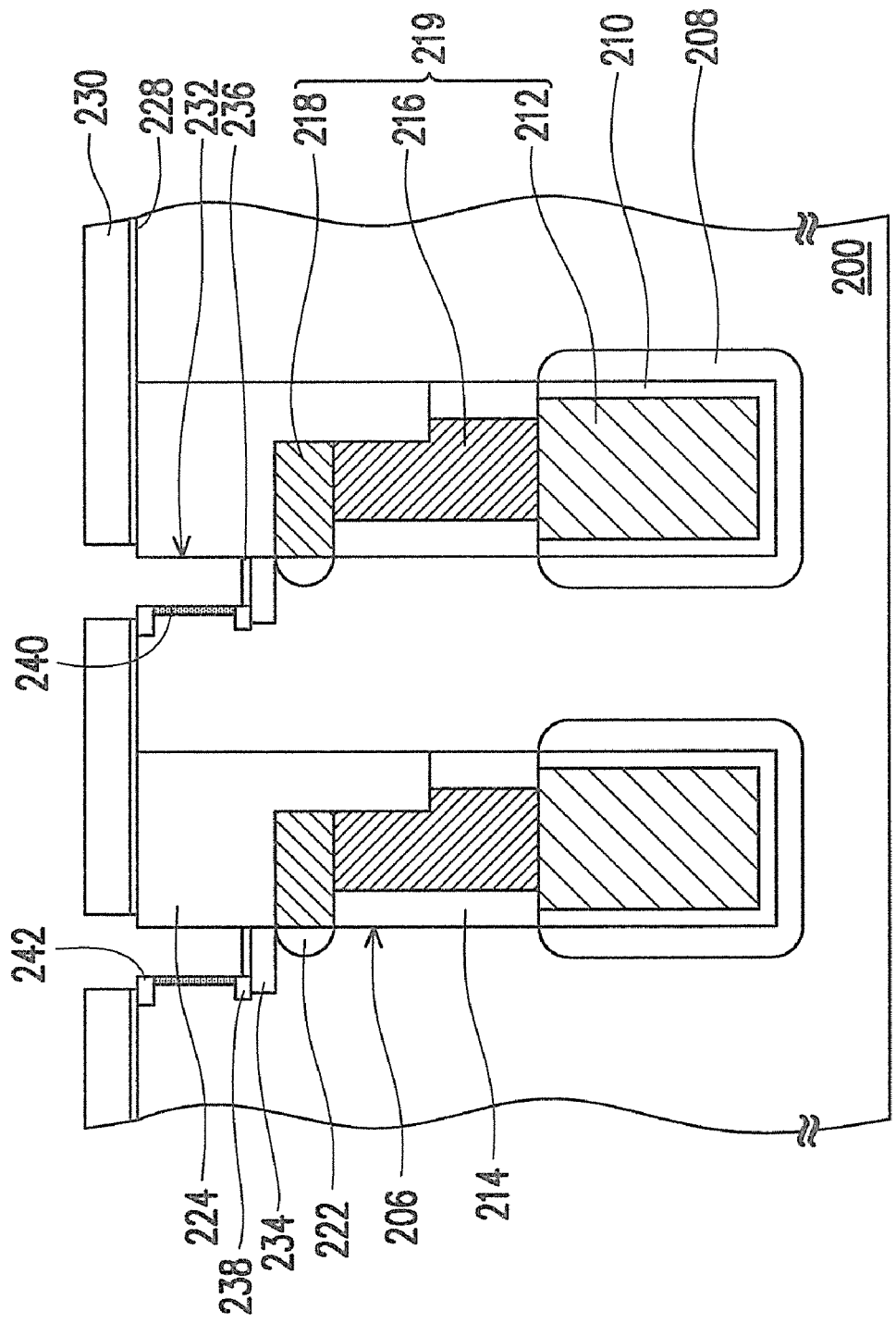
Figure 21:
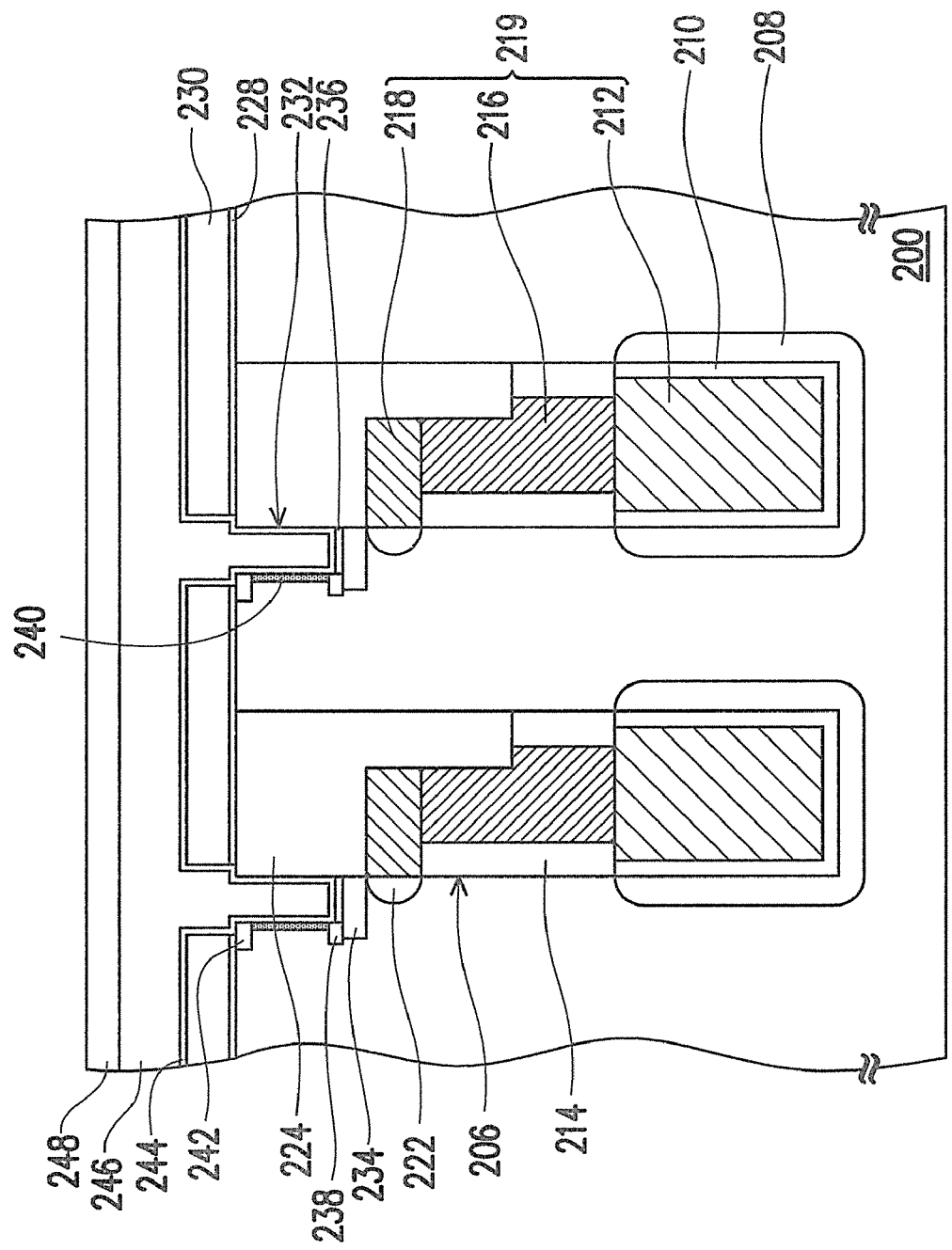

Next, referring to FIG. 2H, a pull back process is performed to remove a portion of the pad nitride layer 230 and a portion of the pad oxide layer 228 to expose a portion of the substrate 200 over the trench 232. The portion of the pad nitride layer 230 and the portion of the pad oxide layer 228 may be removed via isotropic etching.

Next, a second lightly doped region 242 is formed in the exposed region of the substrate 200 on the top of the trench 232. The second lightly doped region 242 may be formed via tilt-angle ion implantation.

Next, referring to FIG. 2I, a gate dielectric layer 244 is formed to conformally cover the whole substrate 200. The material of the gate dielectric layer 244 may be, for example, silicon oxide, and the gate dielectric layer 244 may be formed via thermal oxidation or chemical vapor deposition. Next, a conductive layer 246 is formed on the substrate 200 to cover the gate dielectric layer 244 and fill the trench 232. The material of the conductive layer 246 may be, for example, a polycide including a doped polysilicon layer and a metal silicide layer. The polycide may be fabricated by the following process. First, a doped polysilicon layer is formed via chemical vapor deposition, and then the metal silicide is directly deposited on the doped polysilicon layer, wherein the material thereof may be, for example, tungsten silicide or titanium silicide. Certainly, the conductive layer 246 may be comprised of a single conductive material layer or more than two conductive material layers.

Next, a cap layer 248 is formed on the conductive layer 246. The material of the cap layer 248 may be, for example, silicon oxide, silicon nitride or other suitable insulation materials. The cap layer 248 may be formed via chemical vapor deposition.

Figure 2J:
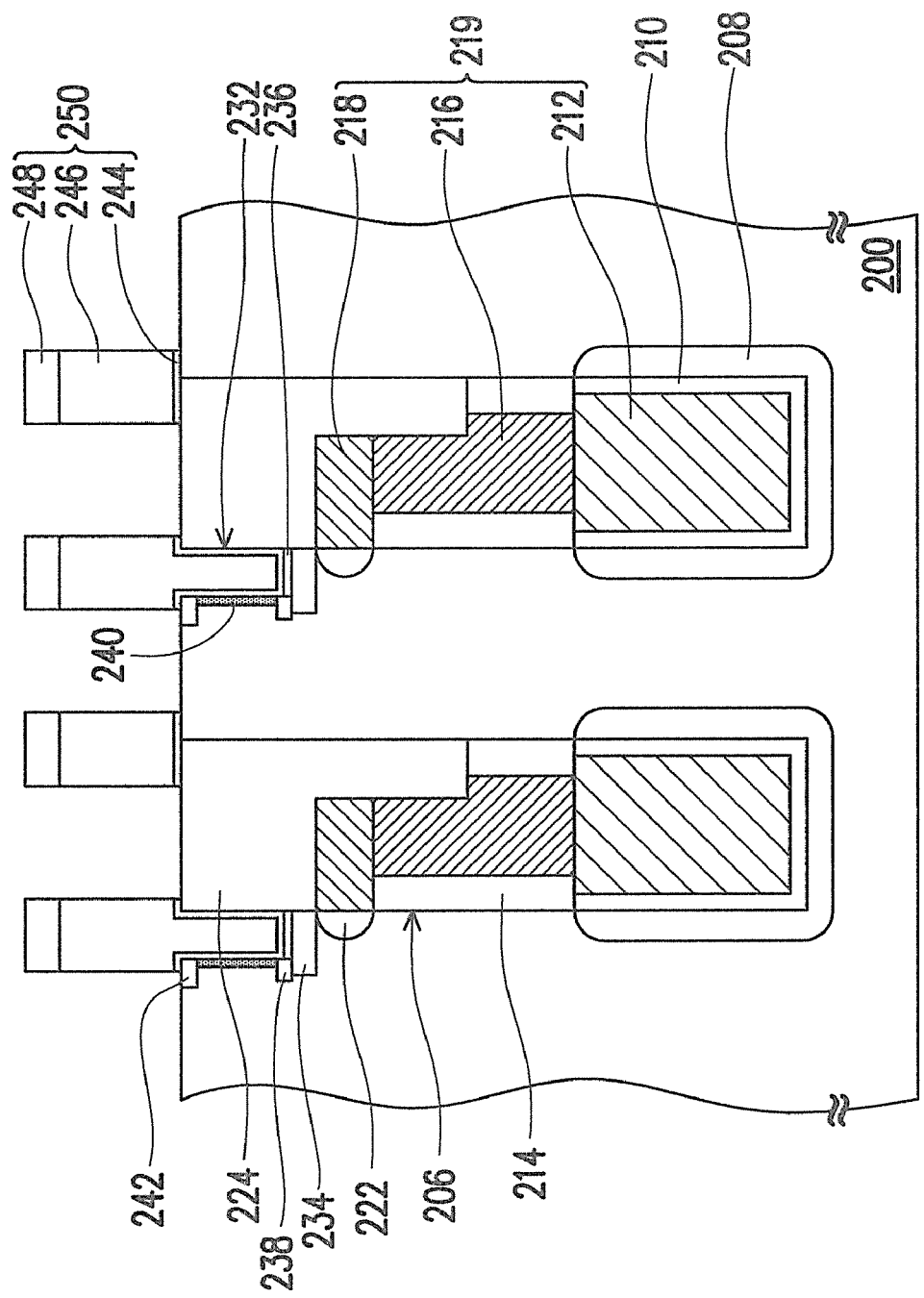

Next, referring to FIG. 2J, the cap layer 248, the conductive layer 246 and the gate dielectric layer 244 are patterned to form a gate structure 250. Next, the pad nitride layer 230 and the pad oxide layer 228 are removed. The pad nitride layer 230 and the pad oxide layer 228 may be removed via an etching process.

Figure 2K:
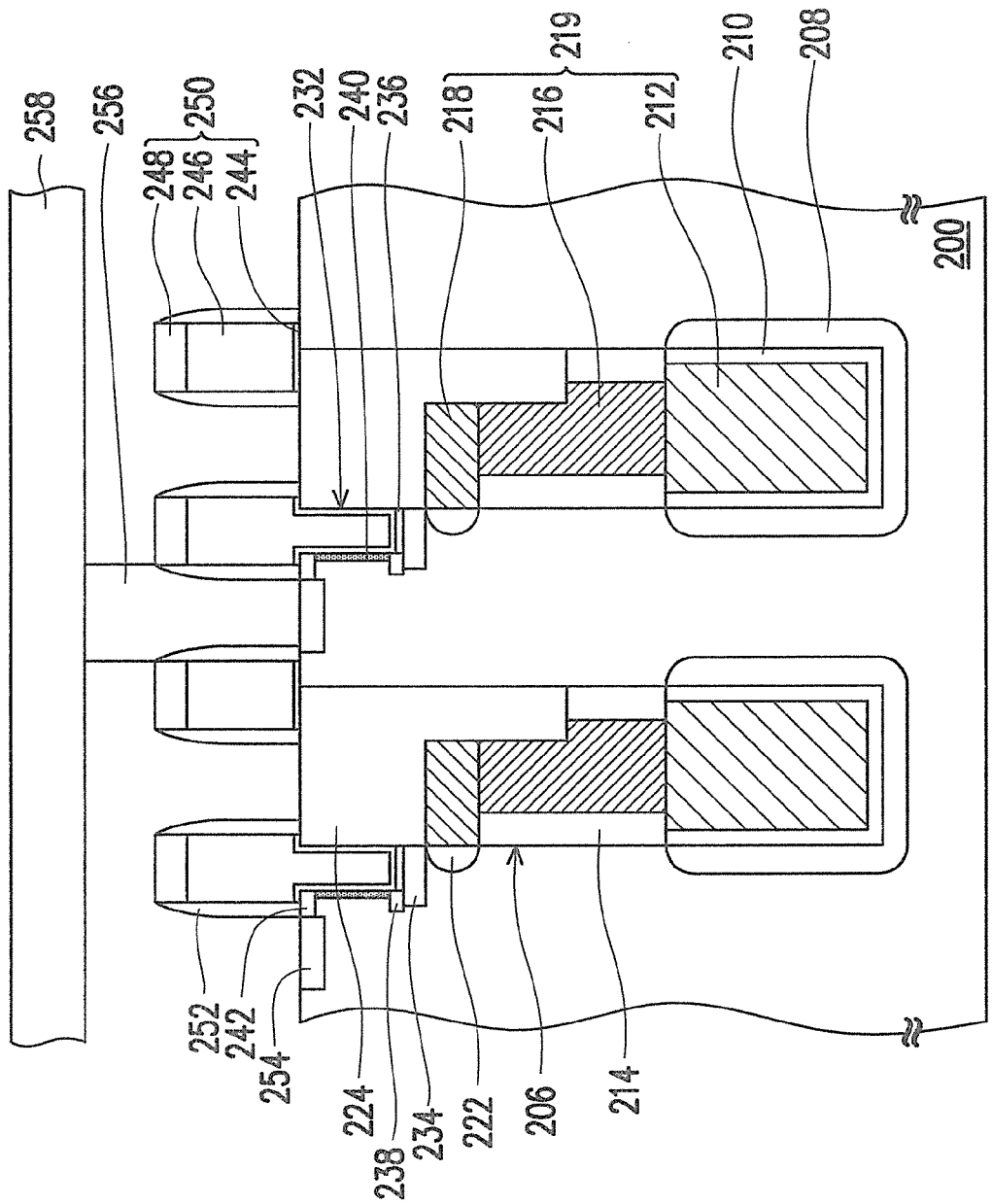

Next, referring to FIG. 2K, a spacer 252 is formed on sidewalls of the gate structure 250. The material of the spacer 252 may be, for example, silicon nitride, silicon oxide or other suitable insulated materials. The spacer 252 may be formed by the following process. First, an insulation layer is formed via chemical vapor deposition, and then an anisotropic etching process is performed to form the spacer 252. Next, a second heavily doped region 254 is formed in the substrate 200 on one side of the gate structure 250. The second heavily doped region 254 may be formed via ion implantation while taking the spacer 252 as a mask.

Moreover, after the second heavily doped region 254 is formed, a correlative interconnection process may be further performed to electrically connect the second heavily doped region 254 with the conductive layer 258 (bit line) through a contact hole 256.

According to an embodiment of the invention, the upper electrode of the deep trench capacitor, including three conductive layers (conductive layers 212, 216 and 218) is taken as an example. Certainly, the upper electrode of the deep trench capacitor may include one conductive layer, two conductive layers, or more than three conductive layers.

According to an embodiment of the invention, the trench 232 may be formed by the following process. First, a patterned pad nitride layer 230 and a patterned pad oxide layer 228 are formed using the deep trench 206 as an alignment reference object. Next, the trench 232 is formed using the patterned pad nitride layer 230 and the patterned pad oxide layer 228 as etching masks. Therefore, the misalignment usually occurring due to an overlay error between the deep trench and the gate can be avoided, and the process windows may be increased accordingly.

Moreover, according to the invention, since the length of the channel region of the vertical transistor is determined by the depth of the trench, the length of the channel region of the vertical transistor may not be limited to the photolithographic etching process, and therefore the integration of the components can be improved. Moreover, the length of the channel region can be accurately controlled by adjusting the depth of the trench below the vertical transistor, such that the problems occurring due to miniaturization of the components can be avoided.

On the other hand, according to the invention, during formation of the buried strap, the doping concentration of the buried strap can be designed according to the processing criteria, and improvement of the doping concentration is unnecessary, such that the floating body effect due to excessive doping concentration of the buried strap can be avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method for DRAM, comprising:
   providing a substrate;
   forming a deep trench in the substrate;
   forming a deep trench capacitor in the deep trench, wherein the deep trench capacitor comprises a bottom electrode, an upper electrode and a capacitor dielectric layer;
   forming a buried strap in the substrate on one side of the upper electrode;
   forming an isolation structure on the upper electrode;
   removing a portion of the substrate adjacent to the isolation structure to form a trench, wherein the trench and the deep trench do not overlap along a depth direction of the trench;
   forming a first doped region on a bottom of the trench to electrically connect to the buried strap;
   forming a dielectric layer on the bottom of the trench;
   forming a second doped region on sidewalls of the trench to electrically connect to the first doped region;
   forming a gate structure on the substrate, wherein the gate structure fills the trench; and
   forming a third doped region in the substrate to electrically connect to the second doped region, wherein
   the bottom of the trench is above a surface of the upper electrode of the deep trench capacitor.

2. The manufacturing method for DRAM as claimed in claim 1, wherein the method of forming the second doped region comprises:
   forming a first lightly doped region with a first concentration on sidewalls of the trench; and
   forming a second lightly doped region in the substrate on the top of the trench.

3. The manufacturing method for DRAM as claimed in claim 2, further comprising a method of forming a channel doped region with a second concentration in the substrate on sidewalls of the trench, wherein the second concentration is less than the first concentration.

4. The manufacturing method for DRAM as claimed in claim 1, further comprising a method of forming a bit line to electrically connect the third doped region.

* * * * *